US 9,177,929 B2

(12) United States Patent
Zhang (10) Patent No.: US 9,177,929 B2
(45) Date of Patent: Nov. 3, 2015

(54) TECHNIQUES FOR FABRICATING FINE-PITCH MICRO-BUMPS (71) Applicant: National Center for Advanced Packaging Co., Ltd., Wuxi, Jiangsu (CN)

(72) Inventor: Wenqi Zhang, Jiangsu (CN)

(73) Assignee: NATIONAL CENTER FOR ADVANCED PACKAGING CO., LTD., Wuxi, Jiangsu (CN)

( * ) Notice: Subject to any disclaimer, the term of this patent is extended or adjusted under 35 U.S.C. 154(b) by 0 days.

(21) Appl. No.: 14/276,481

(22) Filed: May 13, 2014

(65) Prior Publication Data
US 2014/0342545 A1 Nov. 20, 2014

(30) Foreign Application Priority Data

May 16, 2013 (CN) .......................... 2013 1 0186602
Apr. 16, 2014 (CN) .......................... 2014 1 0153971

(51) Int. Cl.
*H01L 23/00* (2006.01)
(52) U.S. Cl.
CPC ................ *H01L 24/11* (2013.01); *H01L 24/13* (2013.01); *H01L 24/03* (2013.01); *H01L 24/05* (2013.01); *H01L 24/81* (2013.01); *H01L 2224/0345* (2013.01); *H01L 2224/0347* (2013.01); *H01L 2224/03452* (2013.01); *H01L 2224/0401* (2013.01); *H01L 2224/05147* (2013.01); *H01L 2224/05166* (2013.01); *H01L 2224/05181* (2013.01); *H01L 2224/05184* (2013.01); *H01L 2224/05187* (2013.01); *H01L 2224/05564* (2013.01); *H01L 2224/05568* (2013.01); *H01L 2224/05647* (2013.01);
(Continued)

(58) Field of Classification Search
CPC ............................................. H01L 2924/13091
USPC ........... 438/612, 613; 257/737, 772, E21.586
See application file for complete search history.

(56) References Cited

U.S. PATENT DOCUMENTS 8,581,420 B2 * 11/2013 Tsai et al. ...................... 257/781
8,796,846 B2 * 8/2014 Lin et al. ....................... 257/737
(Continued)

OTHER PUBLICATIONS

Yu et al. "Fabrication of High Aspect Ratio TSV and Assembly with Fine-Pitch Low-Cost Solder Microbump for Si Interposer Technology with High-Density Interconnects" IEEE Transactions on Components, Packaging and Manufacturing Technology, Vol. 1, No. 9, Sep. 2011, p. 1336-1344.*

*Primary Examiner* — Yu-Hsi D Sun
*Assistant Examiner* — Chi-Hua Yang
(74) *Attorney, Agent, or Firm* — Goodwin Procter LLP (57) ABSTRACT Techniques for fabricating fine-pitch micro-bumps are disclosed. According to one embodiment, a fabrication process may comprise the following steps: depositing a dielectric layer on a wafer; forming a pattern of through holes in the dielectric layer; depositing a seed metal layer on top of the dielectric layer and inside the through holes; depositing a layer of UBM metal on top of the seed metal layer (including inside the holes), and further filling the holes with a low melting point metal; performing chemical mechanical polishing (CMP) to remove conductive material(s) outside the holes and/or on the surface of the dielectric layer, such that the metal stacks of adjacent holes are insulated by the dielectric material between them; and etching the dielectric material surrounding the holes to cause the tip of the metal stacks to extend slightly higher than the surrounding dielectric surface, thereby forming fine-pitch micro-bumps.

20 Claims, 6 Drawing Sheets (52) U.S. Cl.
CPC ............... *H01L 2224/05684* (2013.01); *H01L 2224/10126* (2013.01); *H01L 2224/10145* (2013.01); *H01L 2224/1147* (2013.01); *H01L 2224/1148* (2013.01); *H01L 2224/11462* (2013.01); *H01L 2224/11466* (2013.01); *H01L 2224/11616* (2013.01); *H01L 2224/11825* (2013.01); *H01L 2224/11912* (2013.01); *H01L 2224/13022* (2013.01); *H01L 2224/13023* (2013.01); *H01L 2224/13082* (2013.01); *H01L 2224/13083* (2013.01); *H01L 2224/13109* (2013.01); *H01L 2224/13111* (2013.01); *H01L 2224/13147* (2013.01); *H01L 2224/13562* (2013.01); *H01L 2224/13609* (2013.01); *H01L 2224/13611* (2013.01); *H01L 2224/81191* (2013.01); *H01L 2224/81203* (2013.01); *H01L 2924/01022* (2013.01); *H01L 2924/01029* (2013.01); *H01L 2924/01073* (2013.01); *H01L 2924/01074* (2013.01); *H01L 2924/04953* (2013.01)

(56) References Cited

U.S. PATENT DOCUMENTS

| | | | |
|---|---|---|---|
| 2004/0077154 A1* | 4/2004 | Nagarajan et al. | 438/455 |
| 2009/0236686 A1* | 9/2009 | Shim et al. | 257/528 |
| 2012/0091576 A1* | 4/2012 | Tsai et al. | 257/737 |
| 2012/0161326 A1* | 6/2012 | Choi et al. | 257/772 |
| 2013/0200528 A1* | 8/2013 | Lin et al. | 257/774 |
| 2013/0249106 A1* | 9/2013 | Lin et al. | 257/774 |

* cited by examiner

TECHNIQUES FOR FABRICATING FINE-PITCH MICRO-BUMPS

PRIORITY

The present application claims priority to (a) Chinese Patent Application No. 201310186602.6, filed May 16, 2013 and (b) Chinese Patent Application No. 201410153971.X, filed Apr. 16, 2014, both submitted to State Intellectual Property Office (SIPO) of the People's Republic of China. Both of these prior foreign patent applications are incorporated by reference herein in their entireties.

FIELD OF THE INVENTION

The present innovations relate generally to microelectronics packaging and, in particular, relate to techniques for the fabrication of fine-pitch micro-bumps and their uses in semiconductor interconnect.

BACKGROUND OF THE INVENTION

With the rapid development of microelectronics technology, feature sizes of integrated circuits keep scaling down, leading to ever increasing interconnection density. In the meantime, consumer demand for higher performance and lower power consumption keeps rising as well. The traditional approach of further reducing line width of interconnections to improve circuit performance is already being limited by physical properties of the materials and equipment knowhow. For example, the resistance and capacitance delay of a 2D interconnection line gradually becomes the bottleneck of performance improvement of semiconductor chips. To deal with this predicament, the concept of 3D interconnection has been put forward and through silicon via (TSV) technology has become an appealing solution recently, which can realize 3D interconnection between wafers (or chips) or between a chip and a substrate by producing vertical metal columns in wafers with metal bumps. Such 3D interconnect structures can substantially tackle the limitations of traditional 2D wiring of semiconductor chips. Compared with the traditional stacking techniques including wafer bonding, TSV interconnection method has increased 3D stacking density and reduced packaging dimension, thus greatly improving the speed of a packaged chip and reducing its power consumption. Therefore, TSV technology is widely regarded as one of the key solutions for high density packaging in the future.

TSV is a technique by which vertical via holes are formed between chips or between wafers, and a conductive material is deposited in the vertical via holes (e.g., by electroplating) to realize interconnection in three dimensions. Specifically, after thinning the back surface of the wafer, a top portion (or tip) of the conductive metal in each TSV is exposed from the substrate, and then bumps are formed on the exposed tip. These bumps can be both electrically and mechanically connected with the corresponding bumps (i.e., solder bumps) on adjacent, prefabricated substrates or chips. High-density packaging led to the requirement for fine-pitch bumping technology. Especially in image sensor and 2.5D/3D chip integration area, fine-pitch micro-bumps are indispensable. For example, high-end image sensors featuring a large pixel count, high resolution, and finer pitch between pixels typically require the same level of fine pitch for micro-bumps. Prior micro-bump fabrication process consists of such steps as seed layer deposit, photoresist, lithography, electroplating, and seed layer etching, all these processes except seed layer deposit can affect the pitch of the micro-bumps. In particular, the seed layer etching step brings with it the problem of undercut which can significantly affect the working life of the resulting micro-bumps.

Moreover, with the existing micro-bump technology, it is through a solder ball that the bump tip makes contact with a pad of a corresponding device. However, with the ever decreasing pitch between bumps, the risk of a short circuit happening between solder balls and the adjoining pads already increases to such a level that the device safety will be sacrificed.

A technical solution for the aforementioned problem has not been found in prior art.

SUMMARY OF THE INVENTION

According to one particular embodiment, a method of fabricating fine-pitch micro-bumps, which is based on Damascus process, may comprise the following steps: depositing a dielectric layer on a wafer, then coating it with a photoresist film; carrying out a lithography and then etching step to form a pattern of through holes in the dielectric layer; depositing a seed metal layer on top of the dielectric layer and inside the through holes; depositing a layer of UBM metal on top of the seed metal layer, and further filling the through holes with a low melting point metal; performing chemical mechanical polishing (CMP) on the wafer to remove conductive material (s) outside the holes and/or on the surface of the dielectric layer, such that the metal stacks of adjacent holes are insulated by the dielectric material between them and the low melting point metal is wrapped by the UBM metal except on the top side; and etching the dielectric material surrounding the holes to cause the tip of the metal stacks to extend slightly higher than the dielectric surface, thereby forming fine-pitch micro-bumps.

The present invention offers a number of advantages over prior approaches for fabricating micro-bumps. For example, under-cuts of the micro-bumps can be avoided, thereby allowing the pitch between micro-bumps to be shrunk significantly, such as to a few microns or even shorter (to nanometer level). Also, since the inventive process causes the tips of the metal stacks to be higher than the surrounding dielectric surface, dishing of metal surface caused by the CMP process can be avoided, which ensures a full contact between micro-bumps of one wafer with those of another and also reduces post-CMP requirement for wafer flatness. Furthermore, wafers with micro-bumps fabricated according to the present invention can be bonded with a conventional thermal compression as opposed to more costly bonding methods in the prior art, and the bonding could be achieved at a relatively low temperature.

BRIEF DESCRIPTION OF THE DRAWINGS

The purpose and advantages of the present invention will be apparent to those of skill in the art from the following detailed description in conjunction with the appended drawings in which like reference characters are used to indicate like elements.

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
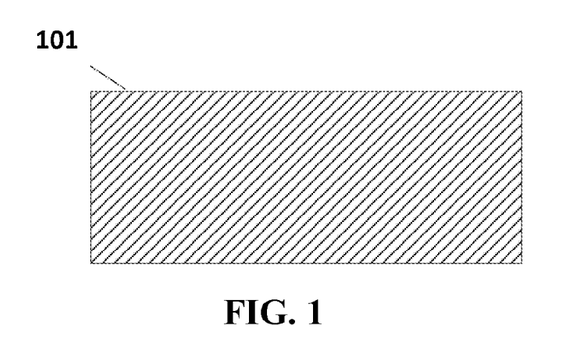
FIG. 1 is a cross-sectional view of a wafer in accordance with one embodiment of the present invention.
Figure 2:
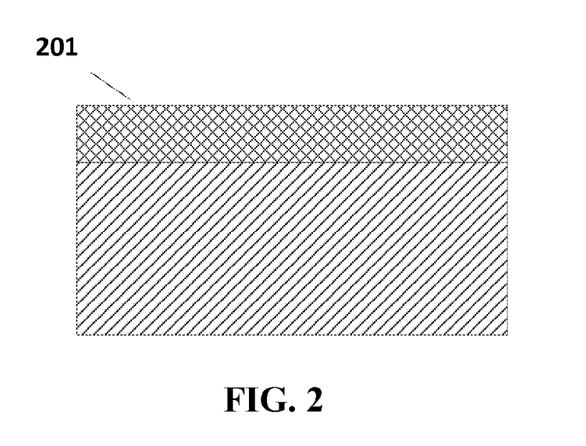
FIG. 2 is a cross-sectional view of the wafer with a dielectric layer deposited thereon.
Figure 3:
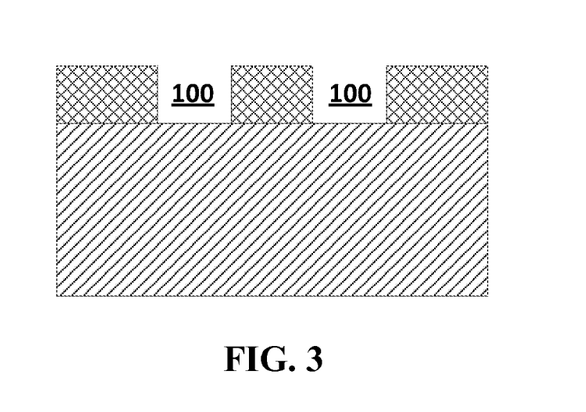
FIG. 3 is a cross-sectional view of the wafer after an exemplary lithographic process.

FIG. 1 to FIG. 10 collectively illustrate an exemplary process for fabricating micro-bumps based on a Damascus process. As shown in FIG. 1, wafer 101 may be a semiconductor wafer after a front-end process, for example, with one or more integrated circuits already fabricated therein. Thereafter, a dielectric layer 201 having a thickness of approximately 1~3 μm may be deposited on wafer 101 as shown in FIG. 2. Then, a pattern of holes 100 may be formed in the dielectric layer 201. The holes 100 may be formed with any of a number of methods. For example, a layer of photoresist (not shown in the drawing) may be applied to the dielectric layer 201 before a lithography step is carried out to transfer a desired pattern (e.g., corresponding to a pattern of contact pads of another wafer to be bonded to the wafer 101) to the dielectric layer 201; then holes which extend into and/or through the dielectric layer 201 may be etched (e.g., in a dry or wet etching process), as shown in FIG. 3. Optionally, before depositing dielectric layer 201, a layer of etch stop material (not shown in FIG. 2), such as silicon carbide, could be deposited to safeguard the wafer 101 from excessive etching during the formation of the holes. Preferably, the silicon carbide layer is compact and free from pinholes. The dielectric layer 201 can be any of silicon oxide, silicon carbide, silicon nitride, and silicon oxynitride. According to some embodiments, the thickness of the dielectric layer 201 is in the range of 1~3 μm.

Figure 4:
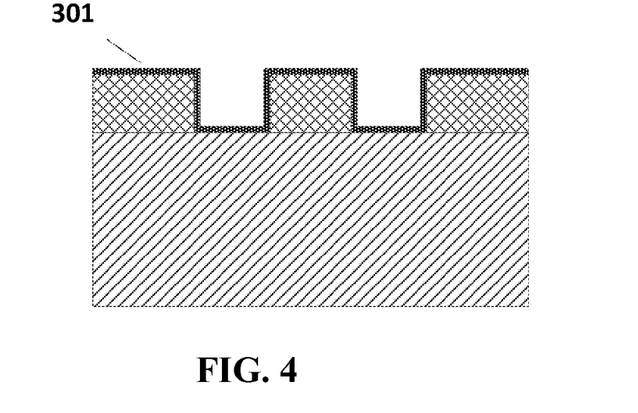
FIG. 4 is a cross-sectional view of the wafer after a seed layer deposition.

Then, as shown in FIG. 4, a seed metal layer 301 may be deposited on top of the dielectric layer 201 and inside the holes 100. The seed metal layer 301 preferably comprises copper as a prerequisite for a later electroplating step. Moreover, considering the diffusivity of copper, a barrier layer is preferably deposited on the dielectric surface and the inside walls and bottom of the holes. The barrier layer may comprise titanium, tantalum, or tantalum nitride. The barrier deposition may take the form of physical vapor deposition (PVD). According to another embodiment, the seed metal layer may alternatively comprise tungsten and, in this case, the deposition of the seed metal layer and the conductive metal can be realized in a single CVD process.

Figure 5:
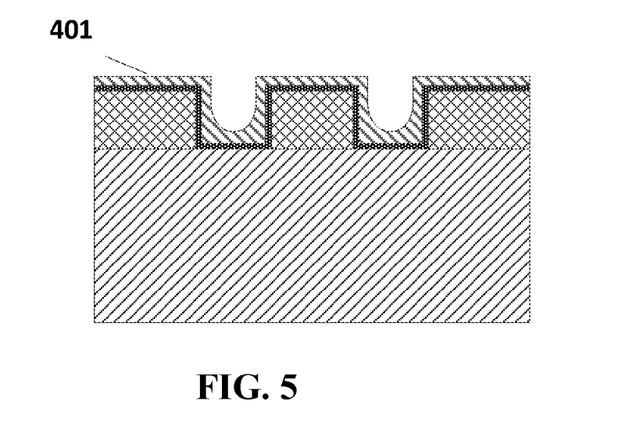
FIG. 5 is a cross-sectional view of wafer after deposition of UBM metal.
Figure 7:
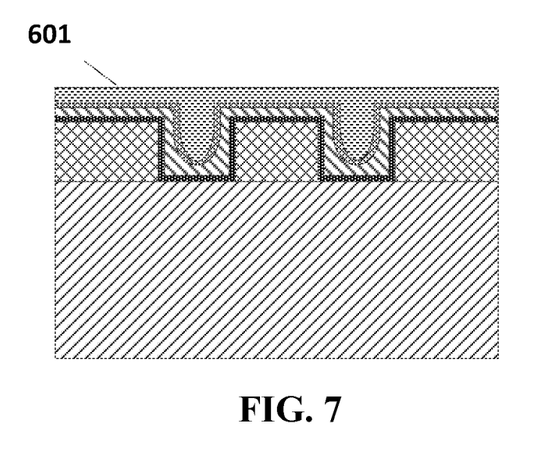
FIG. 7 is a cross-sectional view of the wafer after a low melting point metal is deposited.

FIG. 5 and FIG. 7 illustrate the deposition of a UBM metal 401 and a low melting point metal 601 respectively. The low melting point metal 601 here may be tin, indium, tin silver alloy or tin silver copper alloy, with its thickness in the 0.5~3 μm range. Preferably, the melting point $T_m$ for the low melting point metal is no higher than 250-260° C. After these metal deposition steps, as the UBM metal 401 partially fills the holes 100 and the low melting point metal 601 fills the remaining cavity space of the holes, a metal stack is formed in each hole.

Figure 6:
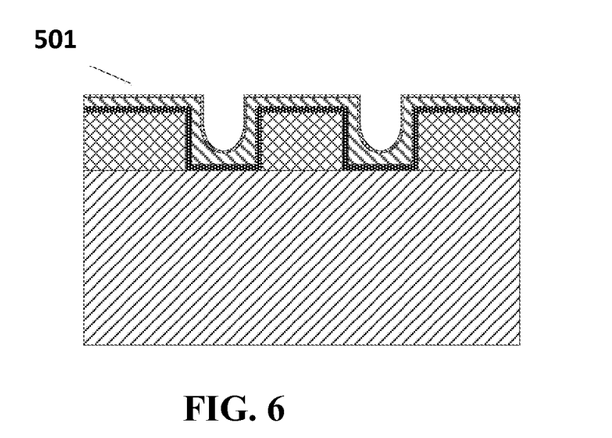
FIG. 6 is a cross-sectional view of the wafer after a barrier layer is deposited.

Preferably, as shown in FIG. 6, a barrier layer 501 may be deposited between the UBM metal 401 and the low melting point metal 601 to prevent formation of large intermetallic compounds due to fast reactions between the low melting point metal 601 and the UBM metal 401. The thickness of the barrier layer 501 may be in the range of 0.3~0.8 μm.

Figure 8:
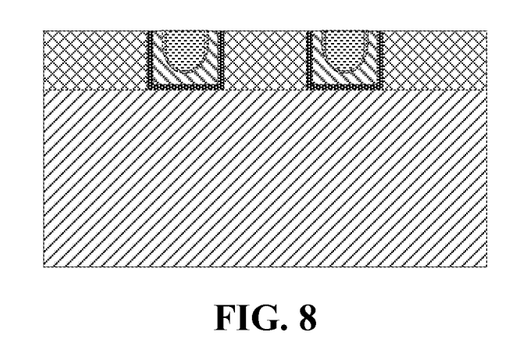
FIG. 8 is a cross-sectional view of the wafer after an exemplary CMP process.

FIG. 8 shows a cross-sectional view of the wafer 101 after a chemical mechanical polishing (CMP) process. The CMP process can remove metal materials from areas outside the holes, such that conductive metals (i.e., metal stacks) in adjacent holes are insulated by the dielectric material 201 between them. Since the amount (or width) of the insulating dielectric material 201 between the holes can be substantially small to the level of several microns or a few hundred nanometers, for instance, thereby allowing the fabrication of fine-pitch micro-bumps of the same magnitude.

Figure 9:
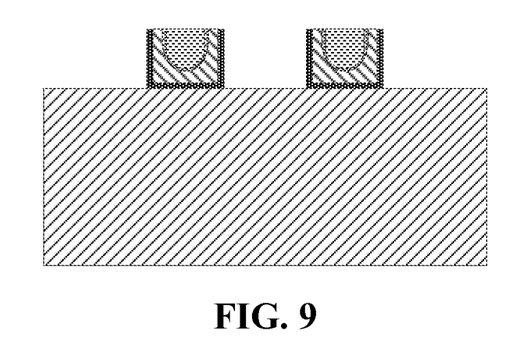
FIG. 9 is a cross-sectional view of the wafer after an exemplary etching step.

Thereafter, the dielectric material 201 surrounding the holes may be subject to a removal (e.g., etching) process to reveal the tip of the metal stack in each hole, until the metal tip is slightly higher than the dielectric surface (e.g., in a range of 100~3000 nm), as shown in FIG. 9. The metal tip may be preferably 1000 nm higher than the silicon oxide surface. The specific etching process may be selected based on the type of the dielectric material 201.

Figure 10:
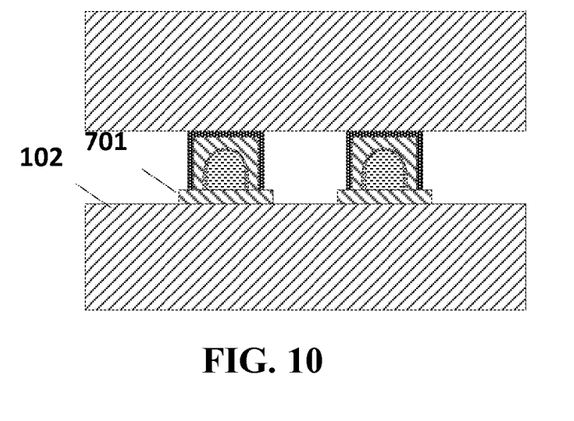
FIG. 10 is a cross-sectional view of the resulting micro-bumps interconnected with pad of another device in accordance with one embodiment of the present invention.

Not only can the low melting point metal 601 prevent oxidation of copper, it can also help lower the thermal compression temperature during wafer bonding process. Since the low melting point metal 601 is contained within or wrapped from all sides by the UBM metal 401 and the contact pads of corresponding device (of another wafer), as shown in FIG. 10, the risk of short happening between solder balls with the adjoining pads can be substantially reduced.

Figure 11:
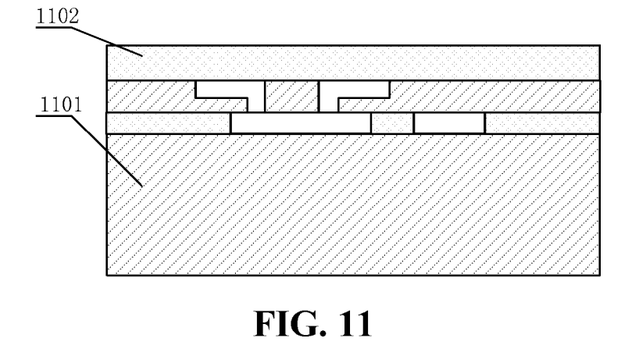
FIG. 11 is a cross-sectional view of an wafer with a dielectric layer deposited in accordance with another embodiment of the present invention.
Figure 12:
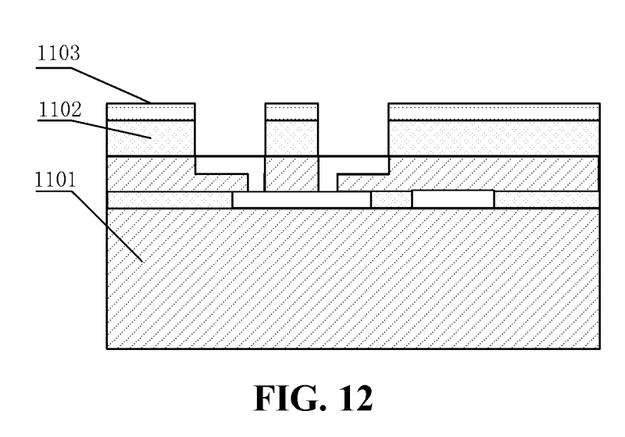
FIG. 12 is a cross-sectional view of the wafer after an exemplary lithographic process.

FIGS. 11-16 collectively illustrate another exemplary process of fabricating micro-bumps based on a Damascus process. As shown in FIG. 11, wafer 1101 is a wafer after a front-end process, with an interconnect circuit already fabricated therein. A dielectric layer 1102 of 1~3 μm in thickness may be deposited on the wafer 1101. In FIG. 11, the structure shown below the dielectric layer 1102 is collectively referred to as the wafer 1101 and may include one or more integrated circuits with a need for external contacts. Then, a layer of photoresist 1103 may be applied to the dielectric layer 1102 before carrying out a lithography step and an etching step to produce through holes which may extend the entire dielectric layer 1102 as shown in FIG. 12. Preferably, before depositing the dielectric layer 1102, an etch stop layer such as silicon carbide (not shown in FIG. 12) may be deposited to safeguard the wafer from over-etching, wherein the etch stop layer (e.g., silicon carbide layer) is preferably compact and free from pinholes. The dielectric layer 1102 can be selected from silicon oxide, silicon carbide, silicon nitride, or silicon oxynitride; and the thickness of the dielectric layer 1102 is preferably 1~3 μm.

Figure 13:
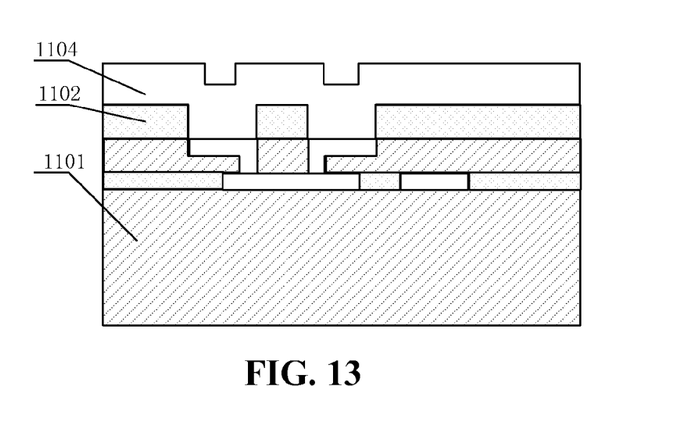
FIG. 13 is a cross-sectional view of the wafer after an exemplary electroplating step.

FIG. 13 shows the status after electroplating the structure with a conductive metal, preferably copper (the seed layer is not shown here). In case of copper seed, which is the prerequisite for later electroplating, a barrier layer is preferably deposited beforehand on the dielectric surface and the inside walls and bottom of the holes, due to the diffusivity of copper. Typically, the barrier material can be titanium, tantalum, or tantalum nitride. The barrier deposition can be achieved with a physical vapor deposition (PVD) process.

The seed layer can also be tungsten; in this case, the deposition of seed and conductive metal can be realized in a single process through a CVD process.

Figure 14:
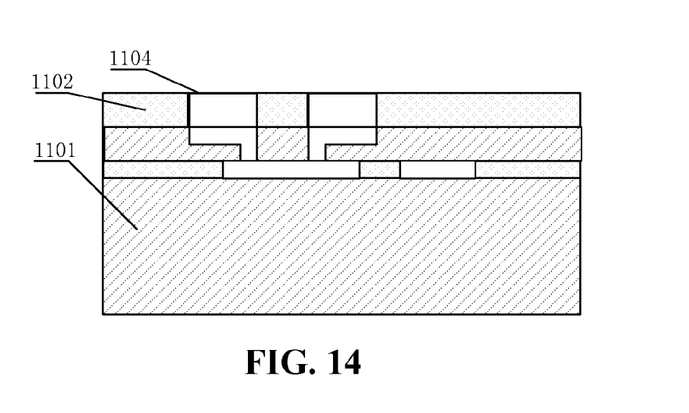
FIG. 14 is a cross-sectional view of the wafer after an exemplary CMP process.

FIG. 14 shows a cross-sectional view of the wafer after a CMP process which has removed the residual metal electroplated outside the holes, so that conductive metals 1104 of adjacent holes be insulated by the dielectric material 1102 between them. Since the width of the insulating dielectric 1102 between adjacent holes can be substantially small, for example a few microns down to a hundred nanometers, the micro-bumps fabricated in this process can achieve a very fine pitch.

Figure 15:
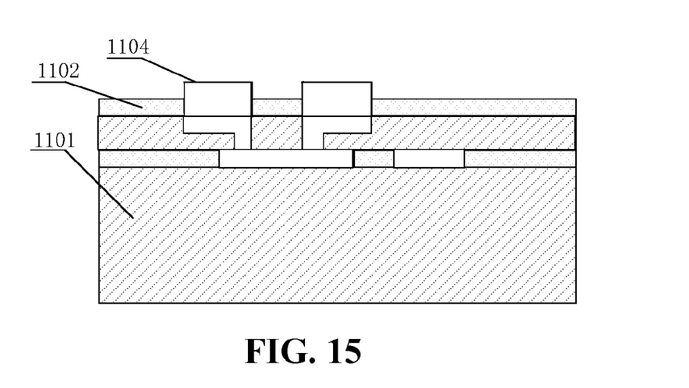
FIG. 15 is a cross-sectional view of the wafer after an exemplary etching step.

Next, an etching process may be performed on the dielectric material surrounding the holes to reveal the tips of the hole-filling metal 1104. The etching may continue until the top surface of the metal tips is slightly higher than the dielectric surface, for example, by about 100~3000 nm, as illustrated in FIG. 15. If the dielectric material 1102 here is silicon oxide, HF acid could be used for the etching process, and the top surface of metal tip may preferably extend about 1000 nm above the silicon oxide surface. The specific etching process depends on the type of the dielectric material 1102.

Figure 16:
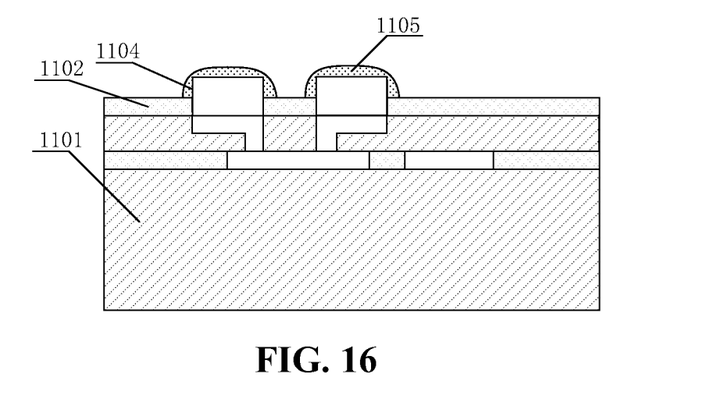
FIG. 16 is a cross-sectional view of the wafer after a low melting point metal is deposited.

Finally, on the top surface of the metal tips, a layer of low melting point metal 1105 (e.g., with $T_m$ no more than 250-260° C.) may be deposited (e.g., through electroplating) as shown in FIG. 16. The low melting point metal here may be tin, indium, tin silver alloy, or tin silver copper alloy; and its thickness may be in the 1~3 μm range. The low melting point metal not only can prevent oxidation of copper, it also can help lower the thermal compression temperature during wafer bonding process. Furthermore, before depositing the low melting point metal, a metal barrier may be deposited to prevent formation of intermetallic compounds between the low melting point metal and the metal tips.

In order to address various issues and advance the art, the entirety of this application shows by way of illustration various example embodiments in which the claimed innovations may be practiced. The advantages and features of the application are of a representative sample of embodiments only, and are not exhaustive and/or exclusive. They are presented only to assist in understanding and teach the claimed principles. It should be understood that they are not representative of all claimed innovations. As such, certain aspects of the disclosure have not been discussed herein. That alternate embodiments may not have been presented for a specific portion of the innovations or that further undescribed alternate embodiments may be available for a portion is not to be considered a disclaimer of those alternate embodiments. It will be appreciated that many of those undescribed embodiments incorporate the same principles of the innovations and others are equivalent. Thus, it is to be understood that other embodiments may be utilized and functional, logical, operational, organizational, structural and/or topological modifications may be made without departing from the scope and/or spirit of the disclosure. As such, all examples and/or embodiments are deemed to be non-limiting throughout this disclosure. Also, no inference should be drawn regarding those embodiments discussed herein relative to those not discussed herein other than it is as such for purposes of reducing space and repetition.

In addition, the disclosure includes other innovations not presently claimed. Applicant reserves all rights in those presently unclaimed innovations, including the right to claim such innovations, file additional applications, continuations, continuations-in-part, divisions, and/or the like thereof. As such, it should be understood that advantages, embodiments, examples, functional, features, logical, operational, organizational, structural, topological, and/or other aspects of the disclosure are not to be considered limitations on the disclosure as defined by the claims or limitations on equivalents to the claims.

What is claimed is:

1. A method for fabricating fine-pitch micro-bumps for semiconductor packaging, the method comprising:
   (a) forming a dielectric layer on a wafer;
   (b) forming a pattern of holes that extend vertically into said dielectric layer;
   (c) depositing a seed metal layer on said dielectric layer and inside said holes;
   (d) forming a layer of a first metal on top of said seed metal layer, the first metal partially filling said holes;
   (e) forming a layer of a second metal on top of said layer of said first metal, said second metal having a low melting point and at least filling remaining cavity space of said holes, such that said first metal and said second metal form a metal stack in each of said holes wherein, inside each metal stack, said second metal is surround from all sides and the bottom by said first metal;
   (f) removing metal materials to expose a top surface of said dielectric layer, such that said metal stack in each of said holes is completely surrounded by said dielectric layer and therefore electrically insulated from every other metal stack; and
   (g) removing at least some of said dielectric layer to cause a top portion of said metal stack in each of said holes to extend higher than the top surface of said dielectric layer.

2. The method of claim 1, wherein said pattern of holes substantially penetrate said dielectric layer.

3. The method of claim 1, wherein said pattern of holes are formed in a dry etching process.

4. The method of claim 1, wherein said first metal comprises an under-bump metallization (UBM) material.

5. The method of claim 1, wherein said low melting point of said second metal is no higher than 260° C.

6. The method of claim 1, wherein said layer of said second metal has a thickness of approximately 0.5~3 μm.

7. The method of claim 1, wherein the step of removing said metal materials further comprises performing a chemical mechanical polishing (CMP) process on said top surface of said dielectric layer.

8. The method of claim 1, further comprising:
   prior to the step of filling, forming a barrier layer on said layer of said first metal to prevent formation of intermetallic compounds between said first metal and said second metal.

9. The method of claim 8, wherein said barrier layer has a thickness range of 0.3~0.8 μm.

10. The method of claim 1, wherein said dielectric layer comprises a dielectric material selected from a group consisting of silicon oxide, silicon carbide, silicon nitride, and silicon oxynitride.

11. The method of claim 1, wherein said seed metal layer comprises copper or tungsten.

12. The method of claim 11, wherein both said seed metal layer and said layer of said first metal are made of tungsten, and wherein the step of depositing said seed metal layer and the step of forming said layer of said first metal are combined into a chemical vapor deposition (CVD) process.

13. The method of claim 11, wherein said seed metal layer is made of copper, further comprising:
depositing, prior to the step of depositing said seed metal layer, a barrier layer comprising titanium, tantalum, or tantalum nitride.

14. The method of claim 1, further comprising:
forming an etch stop layer between said dielectric layer and said wafer.

15. The method of claim 14, wherein the step of forming said pattern of holes further comprises:
etching said dielectric layer until each hole extends all the way through said dielectric layer and reaches said etch stop layer.

16. A method for fabricating fine-pitch micro-bumps for semiconductor packaging, the method comprising:
(a) forming a dielectric layer on a wafer;
(b) forming a pattern of holes that extend vertically into said dielectric layer;
(c) forming a layer of a first metal on top of said dielectric layer and inside said holes, the first metal partially filling said holes;
(d) forming a layer of a second metal on top of said layer of said first metal, said second metal having a low melting point and at least filling remaining cavity space of said holes, such that said first metal and said second metal form a metal stack in each of said holes;
(e) removing metal materials to expose a top surface of said dielectric layer, such that said metal stack in each of said holes is completely surrounded by said dielectric layer and therefore electrically insulated from every other metal stack; and
(f) removing at least some of said dielectric layer to cause a top portion of said metal stack in each of said holes to extend higher than the top surface of said dielectric layer.

17. The method of claim 16, wherein said first metal comprises tungsten.

18. The method of claim 17, wherein said layer of said first metal is formed by a chemical vapor deposition (CVD) process.

19. The method of claim 16, wherein said first metal comprises copper.

20. The method of claim 19, wherein said layer of said first metal is formed by an electroplating process.

* * * * *